United States Patent [19]

Nagami

[11] Patent Number: 4,710,896
[45] Date of Patent: Dec. 1, 1987

[54] SEMICONDUCTOR MEMORY HAVING MULTIPLE ACCESS

[75] Inventor: Akira Nagami, Tokyo, Japan
[73] Assignee: NEC Corporation, Tokyo, Japan
[21] Appl. No.: 648,225
[22] Filed: Sep. 7, 1984
[30] Foreign Application Priority Data
  Sep. 7, 1983 [JP] Japan .................. 58-164475
[51] Int. Cl.$^4$ .............................. G11C 11/24
[52] U.S. Cl. ..................................... 365/149
[58] Field of Search ................. 365/149, 190
[56] References Cited

U.S. PATENT DOCUMENTS

4,535,427 8/1985 Jiang .................... 365/190
4,541,076 9/1985 Bowers et al. .......... 365/156

Primary Examiner—James W. Moffitt
Attorney, Agent, or Firm—Sughrue, Mion, Zinn, Macpeak and Seas

[57] ABSTRACT

An improved semiconductor memory, suitable for a video system, includes a memory cell array, a first access circuit operatively performing a write operation and a read operation to the memory cell array, and a second access circuit operatively performing a read operation to the memory cell array in response to different groups of address signals from those applied to the first access circuit. The two access circuits can operate asynchronously and can simultaneously access the memory.

9 Claims, 11 Drawing Figures

SEMICONDUCTOR MEMORY HAVING MULTIPLE ACCESS

BACKGROUND OF THE INVENTION

The present invention relates to a semiconductor memory having multiple access ports, and particularly a VIDEO RAM suitable to store information to be displayed.

Due to the rapid spread of personal computers, there has been an increasing demand for a memory for generating a video signal, that is, a VIDEO RAM, which is employed for a CRT display.

A VIDEO RAM stores bits which represent an image to be displayed on a CRT. During the display period, the VIDEO RAM is subjected to a read operation to obtain the data for synthesizing the image. The read-out data is applied to the CRT in sync with horizontal and vertical sync signals.

After the display period, the synchronizing signals are inactive to introduce non-display period into the system. During the non-display period, the VIDEO RAM can incorporate new data, defining a new image, under control of a CPU (Central Processing Unit). By repeating the display and non-display periods, the image on the screen of the CRT is renewed.

Access between the VIDEO RAM and the CPU is conducted only during the non-display period. The ratio of the non-display period to the cycle time of the vertical synchronizing signal has significance for evaluating the CPU efficiency. If the above ratio is large, a large amount of data can be exchanged between the CPU and the VIDEO RAM. Simply increasing the above ratio results in a lower display duty. The typical value of CPU efficiency at the present stage is on the order of 30 percent. This value is not enough for a high speed large capacity display system.

For example, even a CPU which can operate at a clock rate of 4 MHz can practically be used only for an operation at a rate of about 1.3 MHz.

The above problem is attributable to the fact that a VIDEO RAM cannot perform write and read operations at the same time.

SUMMARY OF THE INVENTION

It is one object of the present invention to provide a semiconductor memory which can increase the CPU efficiency.

It is another object of the present invention to provide an improved memory in which read and write operations can be performed simultaneously.

The semiconductor memory according to the invention is of the type having an array of memory cells arranged in rows and columns, and a first access circuit for operatively performing a write operation and a read operation in response to a first group of row and column address signals. The memory further comprises a second access circuit operatively performing a read operation in response to a second group of row and column address signals. The second access circuit operates independently of the first access circuit.

According to the above feature of the invention, renewal of the data stored in the memory array can be conducted by the first access circuit while a read operation is being conducted by the second access circuit. Accordingly, the flexibility in renewing data and reading out data can be remarkably increased. For example, when the memory is employed in a video system, the interface of the memory with CPU is enhanced to 100 percent without sacrificing the read operation or decreasing the display quality.

DETAILED DESCRIPTION OF THE INVENTION

Figure 1:
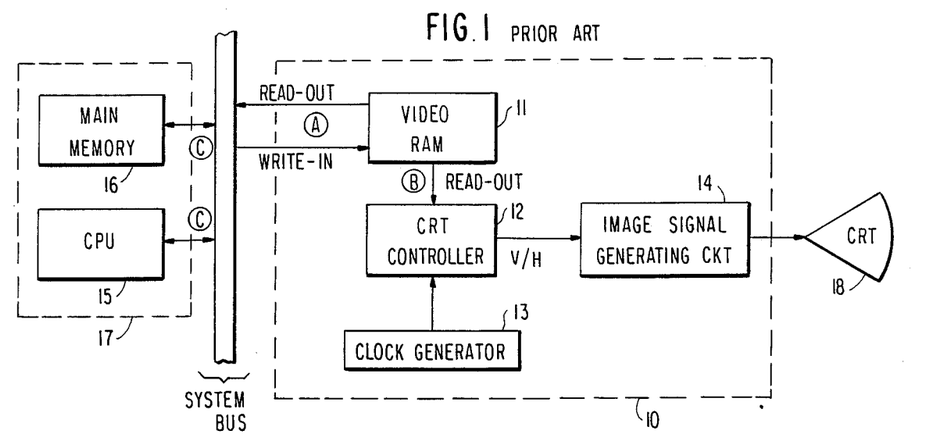
FIG. 1 is a schematic block diagram of a conventional graphic display system.

With reference to FIG. 1, the VIDEO RAM will be described hereinunder. FIG. 1 illustrates a schematic block diagram of a Bit Map type graphic display system which is regarded as leading future CRT displays. The display system is arranged such that, in response to a clock from a clock generator 13, a CRT controller 12 generates a horizontal synchronizing signal (H) and a vertical synchronizing signal (V). These signals plus the data read out from a VIDEO RAM 11, which stores data processed in a CPU system 17, are combined and converted into a video signal to obtain a picture image on the screen of a CRT 18.

Figure 2:
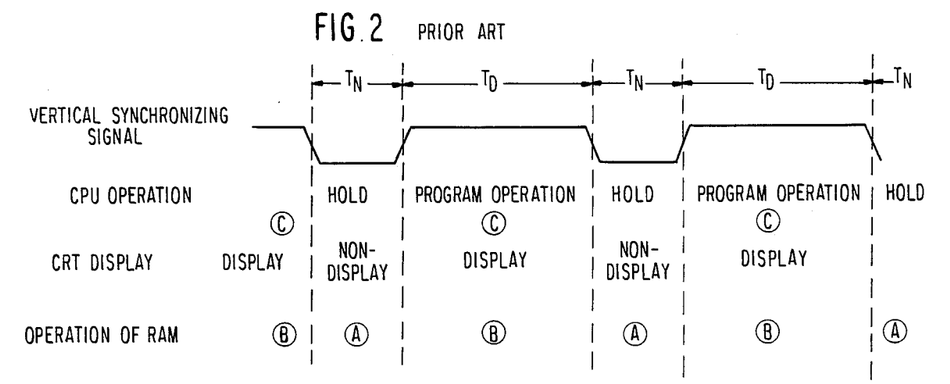
FIG. 2 shows the operations of a conventional display system.

The operations of the CPU system 17 and a CRT system 10 in response to the vertical synchronizing signal are such as those shown in FIG. 2. While the vertical synchronizing signal is at a high level, a read operation B is performed in which data is read out from the VIDEO RAM 11 into the CRT controller 12 and is converted into a video signal to display a picture image on the screen of the CRT 18. During this display period $T_D$, a program operation C is executed between the CPU 13 and a main memory in parallel with the read operation B. As the vertical synchronizing signal shifts to a low level, the CRT screen is placed in a non-display period. During this period $T_N$, a renewing operation A is performed in which display data is transferred between the main memory 16 in the CPU system 17 and the VIDEO RAM 11, that is, a frame is reconstructed. The ratio of the non-display period to the cycle time of the vertical synchronizing signal represents the CPU efficiency. At present, the CPU efficiency value is an unfavorably low 30 percent. In other words, even the CPU 15 which operates on a clock of 4 MHz can practically be used only for an operation of about 1.3 MHz.

This problem is attributable to the fact that the VIDEO RAM 11 cannot simultaneously perform the operations A and B and is consequently obligated to repeat the operations alternately as shown in FIG. 2.

Figure 3:
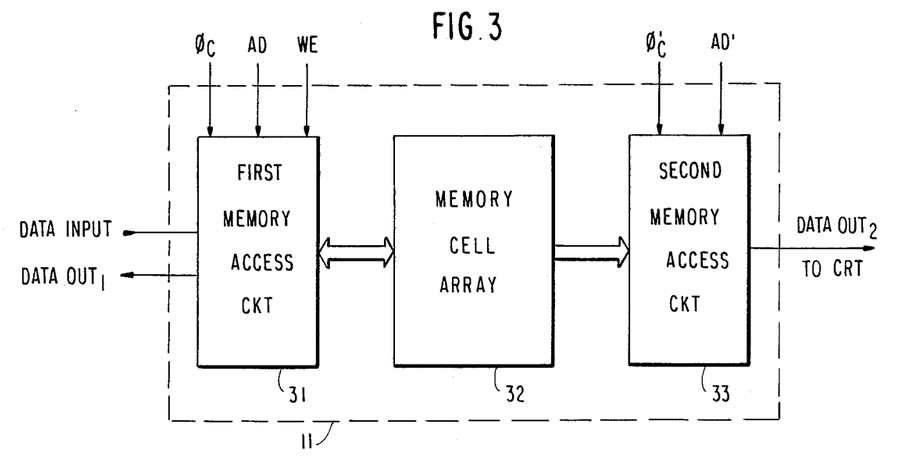
FIG. 3 shows the basic arrangement of a VIDEO RAM in accordance with the invention.

With reference to FIG. 3, the basic structure of a memory according to the invention will be explained.

A semiconductor memory 11 has a first-system memory access circuit 31 provided with input terminals for an address input AD, a data input, a data output, a basic control clock $\phi c$, which serves as a chip activation or selection clock, a write control clock WE, and a second-system memory access circuit 33 provided with input terminals for an address input AD', a data output, and a basic control clock $\phi'c$, which serves as a chip activation or selection clock. The first and second access circuits 31 and 33 are formed on the same semiconductor chip. The circuit 31 is operable to read data from or write data into memory array 32, whereas the circuit 33 is capable only of reading data from memory array 32. The two access circuits are able to operate completely independently of each other.

Each memory cell in the array 32 has two independent data storing nodes. During a write operation data is written into both nodes of a selected memory cell, the two nodes serving the first and second access circuits, respectively. A read operation however reads data from only one of the two nodes; the one selected being dependent upon the access circuit performing the read operation.

Figure 4:
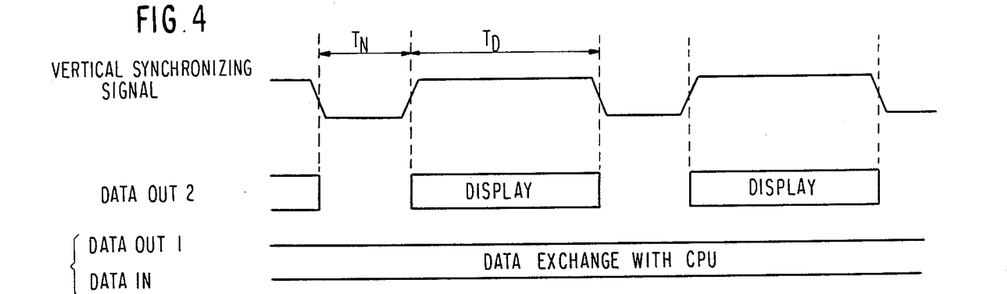
FIG. 4 shows the relationship between the screen display operation and the operations of the VIDEO RAM in accordance with the invention.

The data input terminal and data output terminal, Data Out 1, of the first access circuit 31 are connected to the CPU, while the data output terminal, Data Out 2, of the second access circuit 33 is connected to the CRT. In this case, the operations of the VIDEO RAM in accordance with the invention on the basis of the vertical synchronizing signal is shown as in FIG. 4. Through the output terminal, Data Out 2, of the second access circuit 33, a screen display operation is carried out during the display period $T_D$ similarly to the conventional RAM. Through the input terminal, Data Input, and the output terminal, Data Out 1, it is possible to transfer data between the VIDEO RAM 11 and the CPU system without interruption. Thus, the CPU efficiency is 100 percent.

Figure 5:
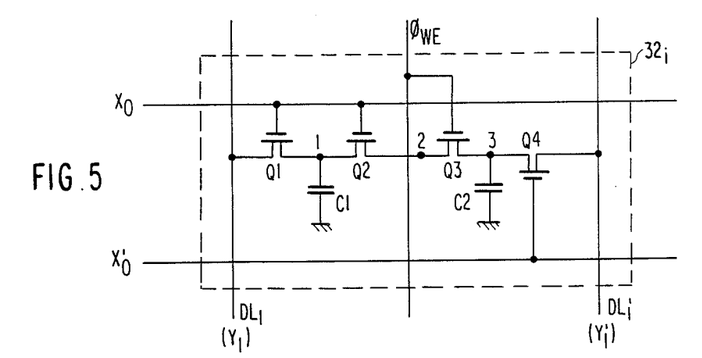
FIG. 5 shows a memory cell circuit for the VIDEO RAM in accordance with the invention.

FIG. 5 shows one example of a memory cell 32$i$ which may compose the elemental unit of the memory array 32 of FIG. 3. MOS transistors (MOSTs) $Q_1-Q_4$ are used in the embodiment described. The cell 32$i$ is at the junction of word line $X_O$ and digit line $DL_1$ (Y1) of the first access circuit and at the junction of word line X'O and digit line $DL_1'$ (Y$_1'$) of the second access circuit.

MOST $Q_1$ has a drain connected to digit line Y$_1$, a gate connected to word line X$_0$ and a source connected to a first node 1; a second MOST $Q_2$ has a drain connected to the first node 1 and a first capacitor $C_1$ which is connected between the first node 1 and a ground potential, a gate connected to the word line X$_0$ and a source connected to a second node 2; a third MOST $Q_3$ has a drain connected to the second node 2, a gate connected to a first internally generated timing signal $\phi$WE, which is related to the first-system memory access circuit, and a source connected to a third node 3; and a fourth MOST $Q_4$ which has a drain connected to the third node 3 and a second capacitor $C_2$, which is connected between the third node 3 and ground potential, a gate connected to word $X_O'$, and a source connected to a digit line $DL_1'$ (Y$_1'$). Data supplied through the first access circuit is stored in the first node 1, and in a write operation caused by the first access circuit, the same data is simultaneously written into both the first node 1 and the third node 3 through the second and third MOSTs $Q_2$ and $Q_3$. The second access circuit only reads out the data stored in the third node 3 through the digit line $DL_1'$ (Y$_1'$).

In the memory cell circuit shown in FIG. 5, a basic unit is constituted by a known one-MOST cell of a dynamic RAM. Most $Q_1$ and capacitor $C_1$ form a storage unit which is accessed by the first-system memory access circuit, while MOST $Q_4$ and the capacitor $C_2$ form another storage unit which is accessed by the second-system memory access circuit. Accordingly, data is stored in node 1 in relation to the operation of the first access circuit and in node 3 in relation to the operation of the second access circuit. Since each cell consists of a dynamic cell, it is necessary to satisfy a refreshing cycle condition for both the first- and second-system memory access circuits. MOSTs $Q_2$ and $Q_3$ serve to write the same data into nodes 1 and 3 when the cell 32$i$ is selected during a write operation. MOST $Q_2$ has its gate connected to the word line $X_O$ of the first access circuit and therefore serves as a row selection gate. MOST $Q_3$ serves as a write column selection gate. The signal $\phi$WE for the cell 32$i$ is generated when the digit line $DL_1$ (Y$_1$) associated with the cell 32$i$ is selected during a write operation.

Figure 6:
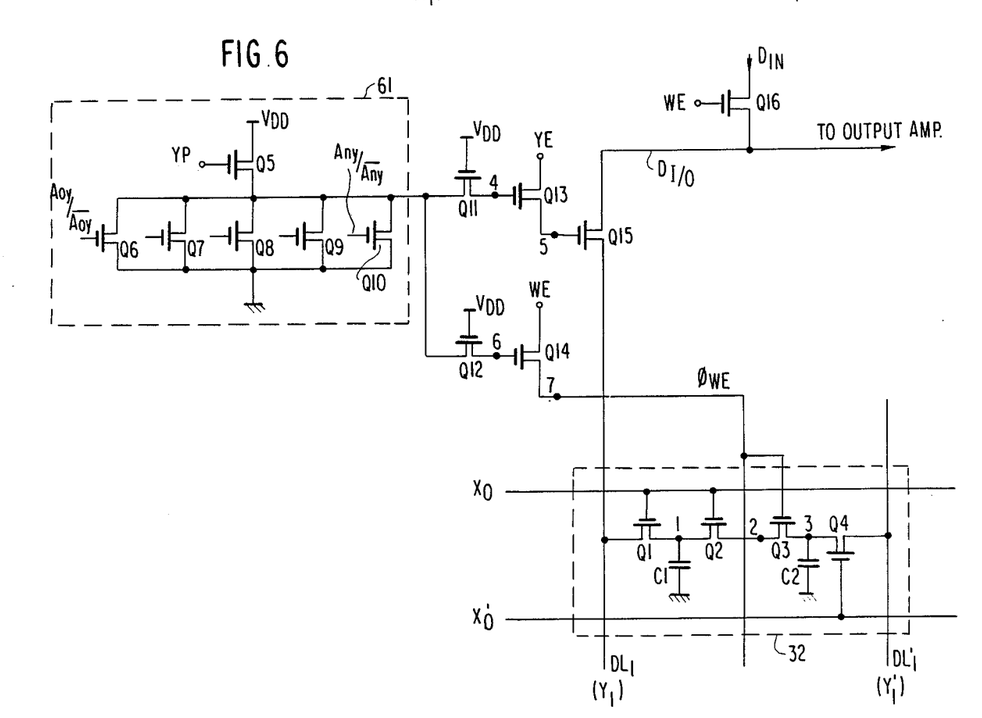
FIG. 6 shows a peripheral circuit for the memory cell circuit in accordance with the invention.

A circuit for generating the signal $\phi$WE for the MOST $Q_3$ will be clear from a practical example thereof shown in FIG. 6.

MOST $Q_5$ to $Q_{10}$ in combination constitute a column decoder 61 of NOR configuration for selecting a digit line Y$_1$. Assuming now that this decoder 61 is selected, after a cell signal on a digit line $DL_1$ (Y$_1$) has been adequately amplified, a column selection enable signal YE rises. In response to this, a node 5 rises through a MOST $Q_{13}$. The digit $DL_1$ (Y$_1$) is connected to a data input/output bus DI/0 through a MOST $Q_{15}$, thereby allowing a read or write operation to be executed. In the case of a write operation, as the write enable signal WE rises in potential, an input data enters the bus DI/0 through a MOST $Q_{16}$ and is transmitted to the digit line $DL_1$ (Y$_1$) through the MOST $Q_{15}$. Assuming now that a word line $X_O$ has been selected, the input data enters both the nodes 1 and 2 through the MOSTs $Q_1$ and $Q_2$. A node 7, connected to the gate of MOST $Q_3$, is common to all memory cells in the same column; here the column constituted by the digit line $DL_1$ (Y$_1$). Thus, when the column decoder 61 is selected, and in response to the rise of timing signal WE, the node 7 rises through a MOST $Q_{14}$. The MOST $Q_3$ conducts, and therefore, the input data is also delivered to the node 3, thereby allowing the same inut data to be written into the node 3 associated with the second-system memory access circuit. Thus, the writing operation of the selected cell by the first access circuit stores data in node 3 corresponding to the second circuit. With this circuit, it is possible to effect the write and read operations of the first access circuit and the read operation of the second access circuit in parallel and completely independently of each other.

With the first and second access circuits operating asynchronously it is possible that the two circuits will access the same cell substantially or completely simultaneously. In order to explain the operation of the novel memory array cell, reference will be made to a four cell array shown in FIG. 7 for a description of four conditions of simultaneous accessing.

Figure 7:
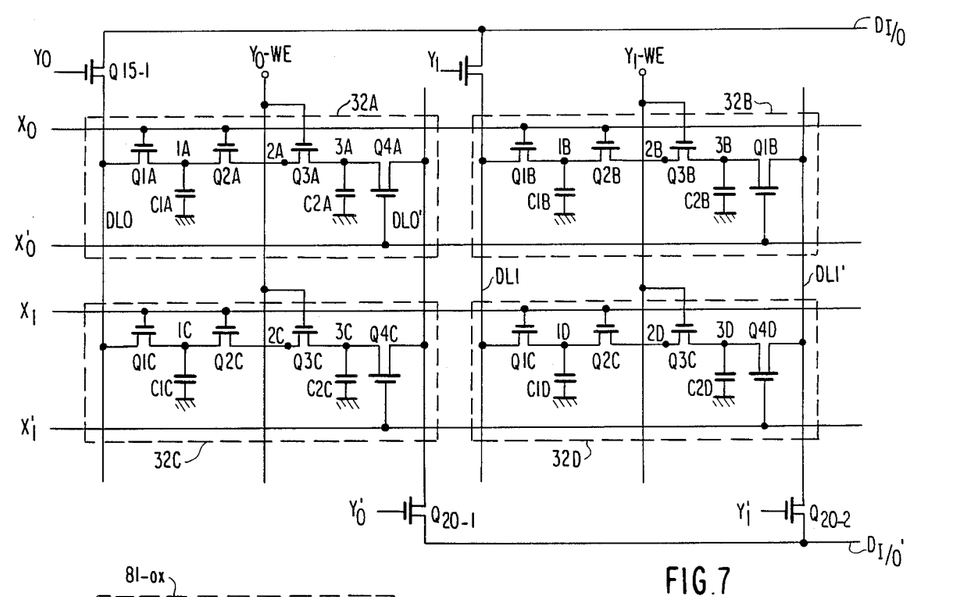
FIG. 7 shows internal circuit operations in the case where the activation periods of two systems overlap with each other.

(1) The first case assumes the two access circuits access two cells having different row and column addresses, e.g., cells 32A and 32D.

According to the latter feature of the invention, the circuit for activating a column (digit) line, such as $Y_0'$, in the second access circuit, is prevented from effecting such activation under the following conditions: the first access circuit addresses a given cell for a write operation and the second access circuit simultaneously addresses the same cell for a read operation.

It is assumed that the first access circuit specifies the address of $X_0$, $Y_0$, i.e., the cell 32A while the second-system memory access circuit specifies the address of $X_1'$, $Y_1'$, i.e., the cell 32 D. In the first access circuit, a write or read operation is conducted in relation to a node 1A of the cell 32A. In the case of a write operation, the same data as that in relation to the node 1A also enters a node 3A. Since MOST $Q_{4A}$ remains non-conductive, no effect is exerted to the digit line DLQ', belonging to the second access circuit. The second access circuit, on the other hand, only reads out the data stored in a node 3D of the cell 32D through the digit line $DL_1$ and is completely isolated from the first-system memory access circuit.

(2) The second case assumes that the specified row addresses (X, X') are coincident with each other but that the specified column addresses (Y, Y$_1$) are different from each other.

It is assumed that the first access circuit specifies the address of $X_0$, $Y_0$, i.e., the cell 32A while the second access circuit specifies $X_0'$ and $Y_1'$, i.e., the cell 32B. When the first access circuit performs a read operation, a MOST $Q_{3A}$ is non-conductive; hence, the data stored in the node 1A is read out independently of the second access circuit. When the first access circuit effects a write operation, since a signal $Y_0 \cdot WE$ (logic product of $Y_0$ and WE) rises in response to the signal WE, the MOST $Q_{3A}$ turns conductive and is connected to the third node 3A of the cell 32A. Since $X_0'$ rises but $Y_0'$ remains at a low level, the MOST $Q_{4A}$ turns conductive. Accordingly, a data input buffer connected to the first-system data input/output bus DI/0 writes input data into the node 1A through the MOSTs $Q_{15-1}$ and $Q_{1A}$ and further delivers the same data to the memory node 3A and a digit line $DL_0'$ through the MOSTS $Q_{2A}$, $Q_{3A}$ and $Q_{4A}$. Since the MOST $Q_{20-1}$ remains non-conductive, the loads which can be seen from the first-system data input buffer coupled to DI/0 are those as far as the digit line $DL_0'$, and it is necessary to ensure the write level as far as the digit line $DL_0'$. On the other hand, the second access circuit reads out the data stored in a node 3B. The second access circuit is, however, isolated from the first access circuit, because MOST $Q_{3B}$ remains non-conductive. The adjacent memory node 1B is subjected to a refreshing operation in response to the rise of $X_0$ as is conventional in a dynamic RAM.

(3) The third case assumes that the specified row addresses are different from each other but the specified column addresses are coincident with each other.

It is assumed that the first access circuit specifies the address of $X_0$ and $Y_0$, i.e., the cell 32A while the second access circuit specifies the address of $X_1'$ and $Y_0'$, i.e., the cell 32C. The first access circuit performs a read or write operation in relation to the node 1A. In the case of a write operation, the same data also enters the node 3A. Since the MOST $Q_{4A}$ remains non-conductive, there is no effect on digit line DL0'. The second access circuit, on the other hand, only reads out the data stored in a node 3C and is completely isolated from the first-system memory access circuit.

(4) The fourth case assumes the specified row and column addresses of the two access circuits are coincident.

It is assumed that the first access circuit specifies the address of $X_0$ and $Y_0$, i.e., 32A while the second access circuit specifies the address of $X_0'$ and $Y_0'$, i.e., 32A. When the data stored in the first memory node 1A is read out, the data stored in the second memory node 3A is also read out in parallel. Since the MOST $Q_{3A}$ remains non-conductive, however, the first- and second-memory nodes are isolated from each other. When the first acess memory circuit performs a write operation, the MOST $Q_{3A}$ turns conductive. The node 1A is connected to the memory node 3A which is subjected to a read operation by the second access circuit. In this case, both $X_0'$ and $Y_0'$ rise, and consequently, the MOSTs $Q_{4A}$ and $Q_{20-1}$ turn conductive. Accordingly, the data input buffer connected to the first-system data input/output bus DI/0 can see as far as the second system data output bus DI/O', since all the MOSTs $Q_{15-1}$, $Q_{1A}$, $Q_{2A}$, $Q_{3A}$, $Q_{4A}$ and $Q_{20-1}$ turn conductive. In such case, if the input data introduced by the first-system data input buffer and the data amplified by an output data amplified (not shown) connected to the second-system data output bus DI/O' are opposite in logic level from each other, a direct current passes therebetween, so that the write operation to the first memory node 1A and the read operation from the memory node 3A both become incomplete, resulting in a malfunction in most cases. In the case of a VIDEO RAM, the display of data on the CRT, that is, the read operation of the second access circuit, is carried out constantly and according to a fixed address order. Therefore, the write operation by the first-system memory access circuit will be given priority over the read operation of the second-system memory access circuit when both occur simultaneously. As will be described in more detail subsequently, output bus DI/0' and the selected digit line ($DL_0'$, $DL_1'$ are isolated from each other, so that the prexisting level of the data output bus at that point of time is amplified to carry out the read operation of the second access circuit, while the write operation of the first access circuit is performed on the selected digit line. A circuit is provided for generating a timing signal for activating the output of a decoder for selecting a digit line of the second access circuit, thereby to realize the above-described operation.

According to the latter feature of the invention, the circuit for activating a column (digit) line, such as $Y_0'$, in the second access circuit, is prevented from effecting such activation under the following conditions: the first access circuit addresses a given cell for a write operation and the second access circuit simultaneously addresses the same cell for a read operation.

Figure 8:
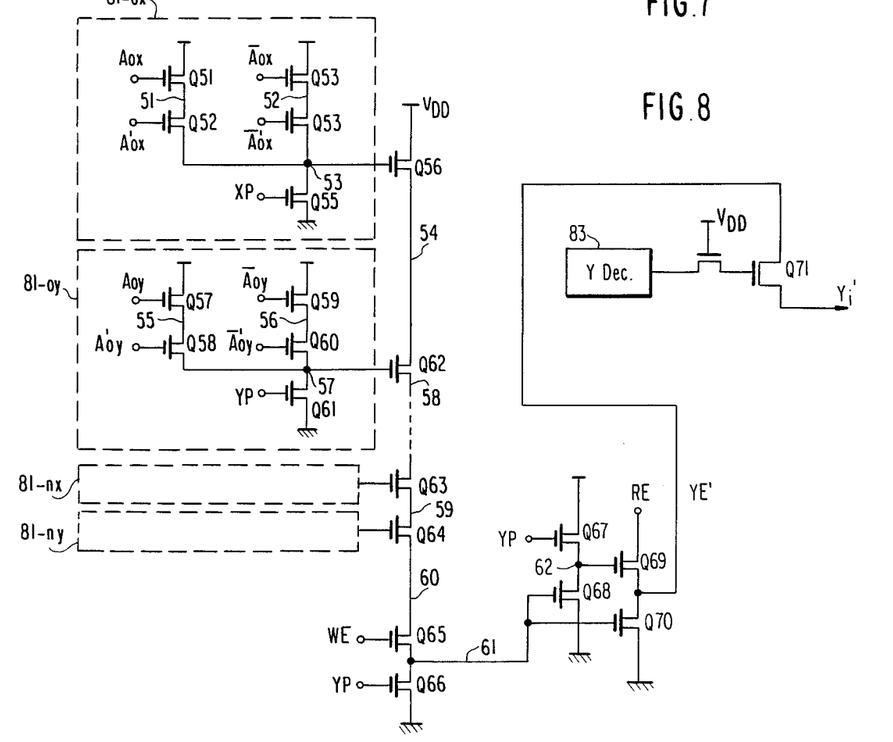
FIG. 8 shows a circuit which generates a signal for activating the output of a second-system digit line selection decoder in accordance with the invention.

FIG. 8 shows a practical example of the circuit for generating the activating timing YE' for activating the output of a decoder for selecting a digit line for the second access circuit in accordance with the invention.

The logical condition of address inputs corresponding to the simultaneous selection of the same cell by the first and second access circuits is detected when the following equation F has a true value:

$$F=(AOx=AOx')\cdot(Alx=Alx')\cdots(Anx=Anx')\cdot$$
$$\cdot(AOy=AOy')\cdot(Aly=Aly')\cdots(Any=Any'),$$

wherein row address inputs Aox to Anx and column address inputs Aoy to Any are applied to the first memory access circuit, while row address inputs AOx' to Anx' and column address inputs Aoy' to Any' are applied to the second memory access circuit. In the equation, "=" means coincidence of both terms. For obtaining every coincident term, e.g., "AOx=AOx'", f(ox)- =AOx . Aox'+$\overline{AOx}$ . $\overline{Aox'}$ is employed. This logic f(ox) is realized by a detection circuit 81-Ox. Similarly, the coincidence of "Aoy=Aoy'" is performed by the logic process, f(Oy)=AOy . AOyl+$\overline{AOy}$ . $\overline{AOy'}$ and this is realized by a detection circuit 81-Oy. Series connected MOSTs $Q_{56}$ to $Q_{64}$ receive the outputs of the respective detection circuits 81-Ox, 81-Oy . . . 81-nx, 81-ny and generate the logic product thereof.

MOST $Q_{65}$ receives the write enable signal WE at a gate thereof and forms a further logic product with MOSTs $Q_{56}$ to $Q_{64}$. A signal YP applied to the gates of MOSTs $Q_{66}$ and $Q_{67}$ is a reset signal which takes a high level during a reset period of the second memory access circuit. MOSTs $Q_{67}$ to $Q_{70}$ form a clocked inverter circuit. The signal XP is a reset signal employed in the second memory access circuit. The signal RE applied to the drain of MOST $Q_{69}$ is a read enable signal in the second memory access circuit. The signal YE' is applied to drains of the column drive MOSTs, such as MOST $Q_{71}$ which generates a column selection signal $Y_i'$ in response to the column decoder of the second memory access circuit.

If all of the row and column address inputs for the first and second access circuits are equal to each other, MOSTs $Q_{51}$, $Q_{52}$ or the MOSTs $Q_{53}$, $Q_{54}$ turn conductive, and the node 53 rises, so that the MOST $Q_{56}$ turns conductive. Similarly, the node 57 rises, and the MOST $Q_{62}$ turns conductive. In this manner, the MOSTs $Q_{63}$, $Q_{64}$, . . . successively turn conductive if all the row and column address inputs coincide with each other. Since the first-system memory access circuit is performing a write operation, the signal WE rises, and the MOST $Q_{65}$ turns conductive, so that the node 61 rises. When the node 61 is at a low level, the signal YE' rises while following the rise of the signal RE through the MOST $Q_{69}$. However, in the case where the first access circuit is performing a write operation and where the row and column address inputs of the first and second access circuits are the same, as described above, the signal YE' is held at a low level or is immediately returned to a low level.

Referring back to FIG. 7, when the first access circuit is performing a write operation and the signal WE rises, the data input buffer connected to the first-system data input/output bus transmits a write level to the digit line $DL_0$, the node 1A, the node 2A, the node 3A and the digit line $DL_1'$ through the MOSTs $Q_{15-1}$, $Q_{1A}$, $Q_{2A}$, $Q_{3A}$ and $Q_{4A}$. By this logic configuration, however, the signal YE' is held at a low level. Therefore, $Y_0'$ is also at a low level, and the MOST $Q_{20-1}$ turns non-conductive, so that the second-system data will be isolated from node 3A. The data written by the first access circuit is stored into both the (first-system) memory node 1A and the (second-system) memory node 3A. On the other hand, the data read out on DI/O' will be the same as that previously read out on DI/O' and may not correspond to the data in the addressed memory cells. However the correct data will be read out in a subsequent read operation.

In the case where the row addresses to both access circuits are coincident with each other as in the above cases (2) and (4), and the first access circuit performs a write operation, the digit line $DL_0'$ in FIG. 7 will be connected to the firstsystem data input buffer. In the case where the selected word line X'O rises just before the end of the write operation of the first-system memory access circuit, the MOST $Q_{4A}$ turns conductive after the write data has adequately been stored in the two nodes 1A and 3A. However, the electric charge for precharging the second-system digit line $DL_0'$ will be connected to memory nodes 1A and 3A when $Q_{4A}$ is conductive. If the written data is low level, the difference in levels at the memory nodes and the line $DL_0'$ will cause a mixing of levels in the memory nodes. It will be appreciated that a precharge operation for the digit lines occurs between read operations. This problem can be overcome by delaying the termination of the write operation of the first access circuit so that it will continue for a period of time after the word line, e.g., X'O , becomes inactive.

Figure 9:
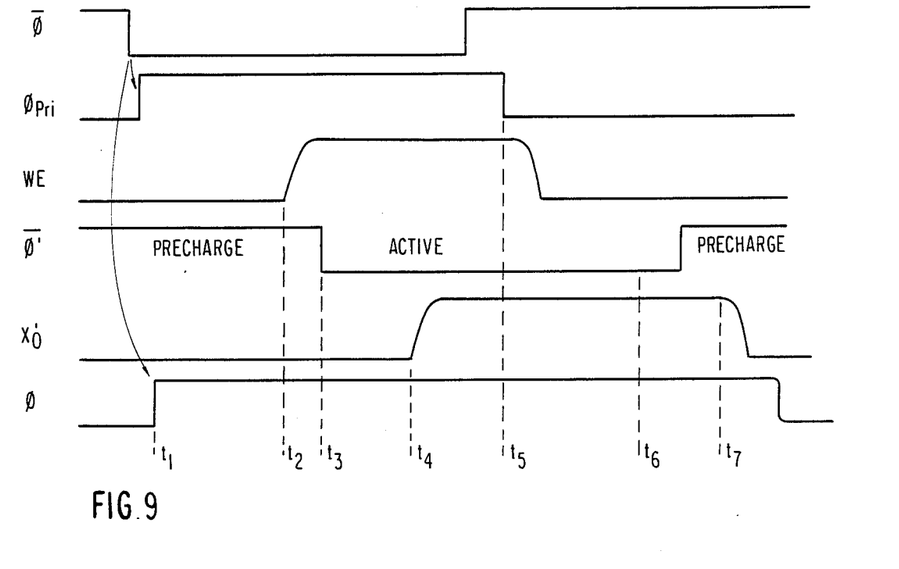
FIG. 9 shows the timing relationship which may cause a write malfunction in the VIDEO RAM of the invention.

The latter problem and its solution can be better understood by reference to the timing signals in FIG. 9 wherein it is assumed that memory cell 32A is selected for a write operation of the first access circuit and a read operation of the second access circuit, but that the latter starts near the end of the former. The signal $\overline{\phi}$ represents the basic clock for the first access circuit. The signal $\phi_{pri}$ is $\phi$ inverted. Note that a small delay will occur in the inverter. WE is the write enable signal for the first access circuit and it is assumed that a low-level logic will be written into cell 32A, specifically nodes 1A and 3A.

The signal $\overline{\phi'}$ is the basic clock for the second access circuit, the low part being the active time and the high part being the precharge time. This clock is applied through several buffer stages to provide the word line enable signal X'O which causes $Q_{4A}$ to conduct. The delay caused by the buffers is unavoidable and results in an overlap between the conduction of $Q_{4A}$ and precharging of digit line $DL_0'$. Thus, during this overlap, the low level charge on node 3A will mix with the high level precharge in $DL_0'$.

In order to avoid the above problem, the present invention employs the internal basic clock $\phi$ which remains in the active state until a time point $t_7$ which is after the completion of activation of X'O. Namely, when the row addresses to the first and second access circuits coincide and the first access circuit conducts a write operation, even if the external clock input to the first access circuit is reset, the write operation by the first access circuit is continued until completion of the signal amplifying operation by the second access circuit.

The latter function is provided by an internal timing generating circuit which adopts a logic configuration in which the write operation by the first access circuit is prevented from being reset (returning to a non-active state) during the period of time from the rise of a word line activating signal generated inside the second access circuit to a point to time when the signal amplifying operation on the digit line is completed. This delay, however, is only achieved in the case where the activation periods of the first and second access circuits overlap with each other, the row (word line) selection addresses specified by both circuits are coincident, and the first access circuit performs a write operation.

Figure 10:
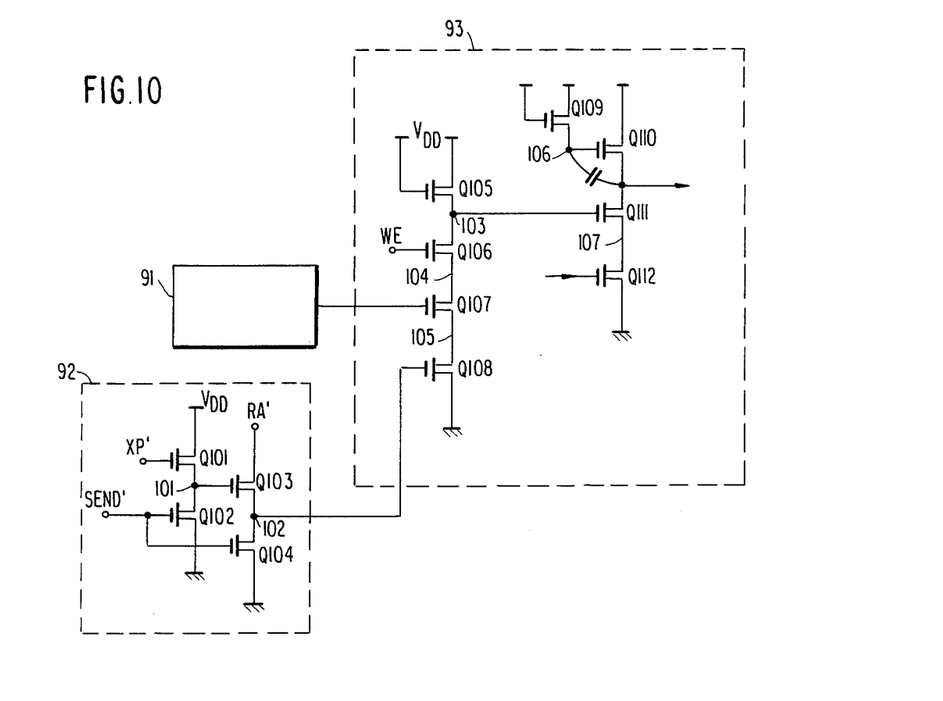
FIG. 10 shows a circuit configuration which eliminates the malfunction in accordance with the invention.

A practical example of the internal timing generating circuit in accordance with this feature of the invention is shown in FIG. 10. MOSTs $Q_{105}$ to $Q_{112}$ belong to the first-system memory access circuit and in combination constitute a first-stage inverter 93 which receives the external basic clock input $\bar{\phi}$. When the TTL level clock $\bar{\phi}$ shifts from a high level to a low level, an activation period is introduced, and the first-stage output $\phi$ rises, thereby to successively generate internal activating operation timings. The MOST $Q_{111}$ is inserted into the basic inverter configuration and its gate is generally charged by the MOST $Q_{105}$ so as to be conductive, so that $\phi$ responds to the change in level of $\bar{\phi}$. However, when the MOSTs $Q_{106}$, $Q_{107}$ and $Q_{108}$ turn conductive, the node 103 shifts to a low level, and the MOST $Q_{111}$ turns non-conductive, so that the change in level of $\bar{\phi}$ is not transmitted to $\phi$.

Conditions of this operation are as follows:

First, it is required that the first-system memory access circuit should be in an activation period, that is, $\bar{\phi}$ should be at a low level, and $\phi$ should be at a high level close to a power supply level $V_{DD}$, and additionally, the first-system memory access circuit should be performing a write operation. Under this set of conditions, the signal WE is at a high level, and consequently, the MOST $Q_{106}$ turns conductive.

Secondly, it is required that the second-system memory access circuit should be in an activation period at the same time, and the row address specified thereby should be coincident with that specified by the first-system memory access circuit. Under this set of conditions, the MOST $Q_{107}$ turns conductive by the output of a coincidence judgement circuit 91. The output f(r) of the judgment circuit 91 is given by the following logic equation:

$$f(r) = (X0 = X0').(X1 = X1') \ldots (Xn = Xn')$$

wherein X0 to Xn are row address inputs supplied to the first memory access circuit while X0' to Xn' are row address inputs supplied to the second memory access circuit.

The judgment circuit 91 is realized by the circuits 81-0X to 81-nX and MOSTs $Q_{56}$ to $Q_{66}$ of FIG. 8 wherein the circuits 81-0Y to 81-nY and their relevant MOSTs $Q_{62}$ and $Q_{63}$ are omitted.

The gate of the MOST $Q_{108}$ is connected to an internal timing generating circuit 92 of the second access circuit which is constituted by MOSTs $Q_{101}$ to $Q_{104}$. The reference symbol RA' represents a signal for driving a selected word line associated with the second-system memory access circuit. In response to the signal RA', the selected word line X'O shown in FIG. 9 rises. The reference symbol SEND' denotes a signal for confirming the end of activation of a sense amplifier connected to a digit line. The digit line has a logic level at a point of time when the activation is completed. In response to the rise of the signal RA', the node 102 rises through the MOST $Q_{103}$. Thereafter, when the signal SEND' rises as the signal amplifying operation on the digit line is completed, the MOSTs $Q_{102}$ and $Q_{104}$ turn conductive, and the node 102 shifts to the ground potential. Accordingly, the MOST $Q_{108}$ having a gate connected to the node 102 is kept conductive during the activation period of the second-system memory access circuit, from the rise of the selected word line to the end of the signal amplification on the digit line. This is a third condition. When these three conditions are satisfied, the node 103 shifts to a low level, and the MOST $Q_{111}$ turns non-conductive. In this case, if the first-system basic clock $\bar{\phi}$ is turned to a high level, $\bar{\phi}$ maintains a high level, that is, the internal timing is left active. The internal timing is reset when the MOST $Q_{111}$ turns conductive. When the signal SEND' rises and consequently the node 102 is placed at the ground potential, the MOST $Q_{108}$ turns non-conductive, and the node 103 is charged by the MOST $Q_{105}$, so that the MOST $Q_{111}$ turns conductive at this point of time. In other words, the reset timing of the first-system memory circuit is delayed until the signal SEND' of the second-system memory access circuit rises, so that it is possible to obtain a write data of a logic level adequate for both the first- and second-system memory nodes, e.g., 1A and 3A.

Referring back to FIG. 7, the cases are again considered where the write operation of the first access circuit and the read operation of the second access circuit are conducted with the same row address designation and with their activation periods overlapping with each other, that is, the above-described cases (2) and (4) are considered hereinunder. In both cases, the first-system data input buffer is required to deliver a write data as far as the second-system digit line $DL_0'$ through the MOSTs $Q_{15-1}$, $Q_{1A}$, $Q_{2A}$, $Q_{3A}$ and $Q_{4A}$ for the case of the cell 32A. These MOSTs, particularly the MOSTs $Q_{2A}$ to $Q_{4A}$ which constitute the memory cell, have a low current capacity owing to the need for minimizing the dimensions thereof. For this reason, it could be a major obstacle in obtaining high-speed characteristics to transmit an adequate write level as far as the digit line $DL_0'$ which has a relatively large load.

To overcome this obstacle, a method is imployed, only in such cases, wherein the data written by the first-system memory access circuit is delivered to the second-system digit line through not only the memory cells but also through another MOST of low impedance.

Figure 11:
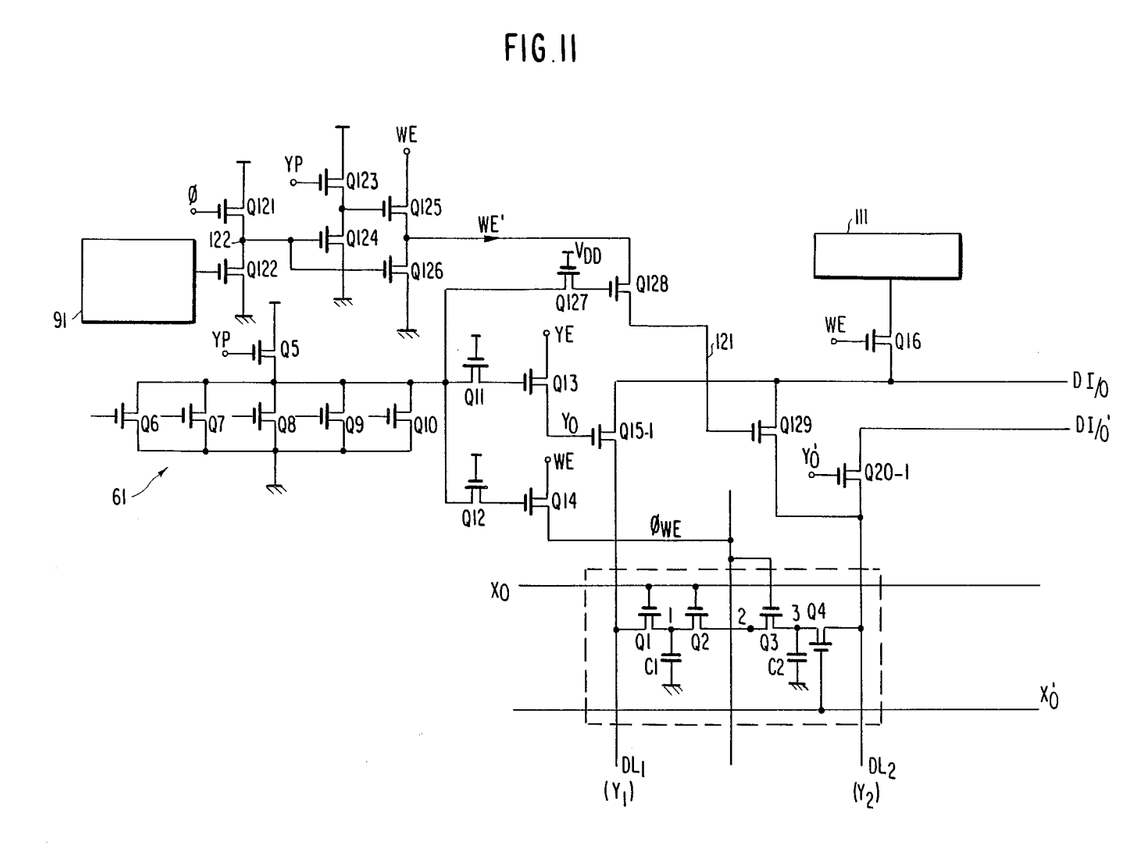
FIG. 11 shows a circuit configuration which eliminates any delay in a write operation of the VIDEO RAM in accordance with the invention.

The circuit configuration for achieving the latter is illustrated in FIG. 11. In FIG. 11, portions corresponding to those in FIG. 6 are denoted by the similar references.

Each column (digit line) is provided with a MOST $Q_{129}$ which has its drain connected to the first-system data input/output bus DI/0 and its source connected to the second-system digit line $DL_2$, and its gate is supplied with a signal generated by AND logic of the first-system write enable signal WE' which is gated so as to be activated only when the activation periods of the first- and second-system memory access circuits overlap with each other and the row (word line) addresses specified by both the circuits are coincident with each other, and the output of each column selection decoder 61 of the first-system memory circuit. When the first- and second-system memory circuits specify row addresses which are coincident with each other, and the write operation by the first-system memory access circuit and the read operation of the second-system memory circuit are carried out in their respective activation periods which overlap with other, the first-system data input buffer 111 first delivers write data to the first-system data input/output bus DI/0 through MOST $Q_{16}$. The write data is transmitted to the first-system digit line $DL_1$, the first-system memory node 1, the node 2, the second-system memory node 3 and the second-system digit line $DL_2$ through MOSTs $Q_{15\text{-}1}$, $Q_1$, $Q_2$, $Q_3$ and $Q_4$. By this arrangement, however, it takes an excessively long time to attain an adequate logic level. For this reason, a MOST $Q_{129}$ is connected between the first-system data input/output bus DI/0 and the second-system digit line $DL_2$. The gate of the MOST $Q_{129}$, that is, a node 121 receives the signal WE' in relation to a selected first-system column decoder 61 to rise through a MOST $Q_{128}$. The signal WE' is the output of a logic gate constituted by MOSTs $Q_{121}$ to $Q_{126}$ which receives the write enable signal WE associated with the first-system memory access circuit. When the row addresses respectively specified by the first- and second-system memory access circuits are coincident with each other, the MOST $Q_{122}$ turns conductive, and the node 122 shifts to a low level. In consequence, the MOSTs $Q_{124}$ and $Q_{126}$ turn non-conductive. In response to the rise of the signal WE, the signal WE' is activated through the MOST $Q_{125}$. After all, when the MOSTs $Q_1$ to $Q_4$ simultaneously turn conductive, the MOST $Q_{129}$ turns conductive correspondingly. As a result, the data delivered from the first-system data input buffer 111 is written into the first-system digit line $DL_1$ and the second-system digit line $DL_2$ through both the MOSTs $Q_{15\text{-}1}$ and $Q_{129}$. Thus, it is possible to obtain an operating speed which is not different from that obtained by the prior art.

As has been described above, the invention makes it possible to obtain a RAM which can handle two-system data independently of each other and in which one of the two-system memory access circuits is capable of random write and read operations and the other memory circuit is capable of random reading of the data written by the first system. Further, each memory cell is basically constituted by known one-MOST cells, which makes it possible to increase the capacity of the memory. Furthermore, it is possible to operate the two-system memory circuits completely asynchronously with each other at the same speed as that of an ordinary dynamic RAM. Thus, the semiconductor memory of the invention is most suitable for use in a VIDEO system and is extremely effective in improvement of the system performance.

I claim:

1. A semiconductor memory, comprising: first word lines, first digit lines arranged vertically with respect to said first word lines, second word lines, second digit lines arranged vertically with respect to said second word lines, and a plurality of memory cells, each of said memory cells including a first capacitor means having one end connected to a fixed potential line, a second capacitor means having one end connected to said fixed potential line, a first field effect transistor coupled between another end of said first capacitor means and an associated one of said first digit lines and having a gate coupled to an associated one of said first word lines, a series circuit of second and third field effect transistors coupled between the other end of said first capacitor means and another end of said second capacitor means, a gate of said second transistor being connected to said associated one of said first word lines, a gate of said third transistor being supplied with a write selection signal, and a fourth field effect transistor coupled between the other end of said second capacitor means and an associated one of said second digit lines and having a gate coupled to an associated one of said second word lines.

2. A semiconductor memory, comprising:
a memory array of memory cells arranged in rows and columns,
a first access circuit responsive to a first set of row and column address signals and a read-write control signal for selectively writing data into and reading data out of memory cells of said memory array addressed by said address signals, and
a second access circuit responsive to a second set of row and column address signals for reading data from memory cells of said memory array defined by said second set of row and column address signals,
said memory array including first word lines, second word lines, first digit lines arranged vertically to said first word lines, and second digit lines arranged vertically to said second word lines, said first word lines and said first digit lines being adapted to be connected to said first access circuit, said second word lines and said second digit lines being adapted to be connected to said second access circuit, and
each of said memory cells including first and second capacitance means, each having one end connected to a fixed potential line, a first field effect transistor coupled between another end of said first capacitance means and an associated one of said first digit lines and having a gate coupled with an associated one of said first word lines, a series circuit of second and third field effect transistors coupled between the other end of said first capacitance means and another end of said second capacitance means, a gate of said second field effect transistor being connected to said associated one of said first word lines, a gate of said third field effect transistor being supplied with a write selection signal, and a fourth field effect transistor coupled between the other end of said second capacitance means and an associated one of said second digit lines and having a gate coupled to an associated one of said second word lines.

3. The invention as claimed in claim 2, further comprising first control means for operatively inhibiting said second access circuit from reading data from a memory cell of said memory array when both of said first and second access circuits simultaneously address said memory cell for a write operation and a read operation, respectively.

4. The invention as claimed in claim 2, further comprising,
means for detecting when said first and second access circuits simultaneously address in the same row of a write and read operation, respectively, and
means responsive to said detecting means for maintaining active the write operation of said first access means until a short period of time following termination of the read operation of said second access circuit.

5. The invention as claimed in claim 2, wherein, said first access circuit includes a first bus line and a plurality of first transfer gates coupled between said first bus line and a plurality of said first digit lines, respectively; said second access circuit includes a second bus line and a plurality of second transfer gates coupled between said second bus line and a plurality of said second digit lines, respectively; and further comprising, a plurality of third transfer gates coupled between said first bus line and said plurality of second digit lines, and control means for selectively enabling one of said third transfer gates when said first and second access circuits designate the same row address and said first access circuit performs a write operation.

6. A semiconductor memory, comprising: first word lines, first digit lines, second word lines, second digit lines, write control lines and a plurality of memory cells, each of said memory cells including a first capacitor means having one end connected to a fixed potential line, a second capacitor means having one end connected to said fixed potential line, a first field effect transistor coupled between another end of said first capacitor means and an associated one of said first digit lines and having a gate coupled to an associated one of said first word lines, a second field effect transistor coupled between another end of said second capacitor means and one of said second digit lines and having a gate coupled to one of said second word lines, and a switch circuit coupled between the other end of said first capacitor means and the other end of said second capacitor means and having a control terminal coupled to one of said write control lines, said switch circuit operatively providing a current path between the other ends of said first and second capacitor means in response to a selection signal on said one of said write control lines.

7. The invention as claimed in claim 6, in which said first digit lines are arranged vertically with respect to said first word lines and said second digit lines are arranged vertically with respect to said second word lines.

8. A semiconductor memory, comprising:
a memory array of memory cells arranged in rows and columns,
a first random access circuit responsive to a first set of row and column address signals and a read-write control signal for selectively writing data into and reading data out of memory cells of said memory array addressed by said address signals, and
a second random access circuit responsive to a second set of row and column address signals for reading data from memory cells of said memory array defined by said second set of row and column address signals.
said memory array including first word lines, second word lines, first digit lines, and second digit lines, said first word lines and said first digit lines being adapted to be connected to said first access circuit, said second word lines and said second digit lines being adapted to be connected to said second access circuit,
each of said memory cells including a first capacitive data storage means, a first transfer gate having a current path coupled between said first capacitive data storage means and one of said first digit lines and a control electrode coupled to one of said word lines, a second capacitive data storage means, a second transfer gate having a current path coupled between said second capacitive storage means and one of said second digit lines and a control electrode coupled to one of said second word lines, said first capacitive data storage means being accessed only by said first random access circuit through one of said first digit lines and one of said first word lines, said second capacitive data storage means being accessed only by said second random access circuit through one of said second digit lines and one of said second word lines, and a data transfer circuit coupled between said first capacitive data storage means and said second capacitive data storage means for selectively writing data stored in said first capacitive data storage means in said second capacitive data storage means in response to a write selection signal.

9. The invention as claimed in claim 8, in which said data transfer circuit includes a series circuit of third and fourth transfer gates connected in series between said first and second capacitive data storage means, a control electrode of said third transfer gate being connected to said one of said first word lines, and a control electrode of said fourth transfer gate being supplied with said write selection signal.

* * * * *

UNITED STATES PATENT AND TRADEMARK OFFICE
CERTIFICATE OF CORRECTION

PATENT NO. : 4,710,896
DATED      : December 1, 1987
INVENTOR(S) : Akira Nagami

It is certified that error appears in the above-identified patent and that said Letters Patent is hereby corrected as shown below:

Column 2, line 59, After "CPU" change "13" to -- 15 --;

Column 4, line 1, change "$X_0$," to -- $X'_0$ --;

Column 4, line 56, change "inut" to -- input --;

Column 5, line 22, change "DLQ'" to -- $DL_0'$ --;

Column 5, line 26, change "$DL_1$" to -- $DL_1$, --;

Column 5, line 43, after "conductive" insert --, while the MOST $Q_{20-1}$ remains non-conductive --;

Column 6, line 43, before "are" insert -- ) --;

Column 8, line 7, change "firstsystem" to -- first-system --;

Column 10, line 35, change "imployed" to -- employed --;

Column 14, line 2, after "signals" change the period to a comma.

Signed and Sealed this

Sixteenth Day of August, 1988

Attest:

DONALD J. QUIGG

*Attesting Officer*     *Commissioner of Patents and Trademarks*